US005736808A

United States Patent [19]

Szilagyi et al.

[11] Patent Number: 5,736,808

[45] Date of Patent: Apr. 7, 1998

[54] PIEZOELECTRIC SPEAKER

[75] Inventors: Andrei Szilagyi, Rancho Palos Verdes; Michael Strugach, Calabasas, both of Calif.

[73] Assignee: Aura Systems, Inc., El Segundo, Calif.

[21] Appl. No.: 577,279

[22] Filed: Dec. 22, 1995

[51] Int. Cl.$^6$ .......... H01L 41/08; H04R 17/02

[52] U.S. Cl. .......... 310/322; 310/330; 310/331; 310/334; 310/348

[58] Field of Search .......... 310/322, 330, 310/331, 334, 348

[56] References Cited

U.S. PATENT DOCUMENTS

| | | | |
|---|---|---|---|
| 1,526,319 | 2/1925 | Chubb | 310/328 |
| 2,386,279 | 10/1945 | Tibbetts | 310/328 |
| 3,109,111 | 10/1963 | Wiggins | 310/128 |
| 3,268,855 | 8/1966 | Hagey | 340/15 |
| 3,278,695 | 10/1966 | Craig et al. | 179/110 |
| 3,560,771 | 2/1971 | Baker | 310/328 |
| 4,045,695 | 8/1977 | Itagaki et al. | 310/322 |
| 4,283,605 | 8/1981 | Nakajima | 179/110 |
| 4,379,211 | 4/1983 | Joscelyn et al. | 179/110 |
| 4,607,186 | 8/1986 | Takayama et al. | 310/324 |
| 4,696,045 | 9/1987 | Rosenthal | 381/114 |
| 5,514,927 | 5/1996 | Tichy | 310/330 |
| 5,541,467 | 7/1996 | Kaida et al. | 310/321 |

*Primary Examiner*—Thomas M. Dougherty
*Attorney, Agent, or Firm*—Kathy Mojibi Kavcioglu

[57] ABSTRACT

A piezoelectric speaker is disclosed. The speaker includes a rigid structure, a piezoelectric material bender, and a wave guide mounted to both the rigid structure and the bender and serving to interconnect the rigid structure and the bender. The wave guide is a fabricated from a rigid material and is mounted to the bender at approximately the geometric center of the bender. The bender is also encapsulating a case. The rigid structure may include a computer keyboard, a bicycle helmet or any other rigid structure.

2 Claims, 8 Drawing Sheets

FIG. 6
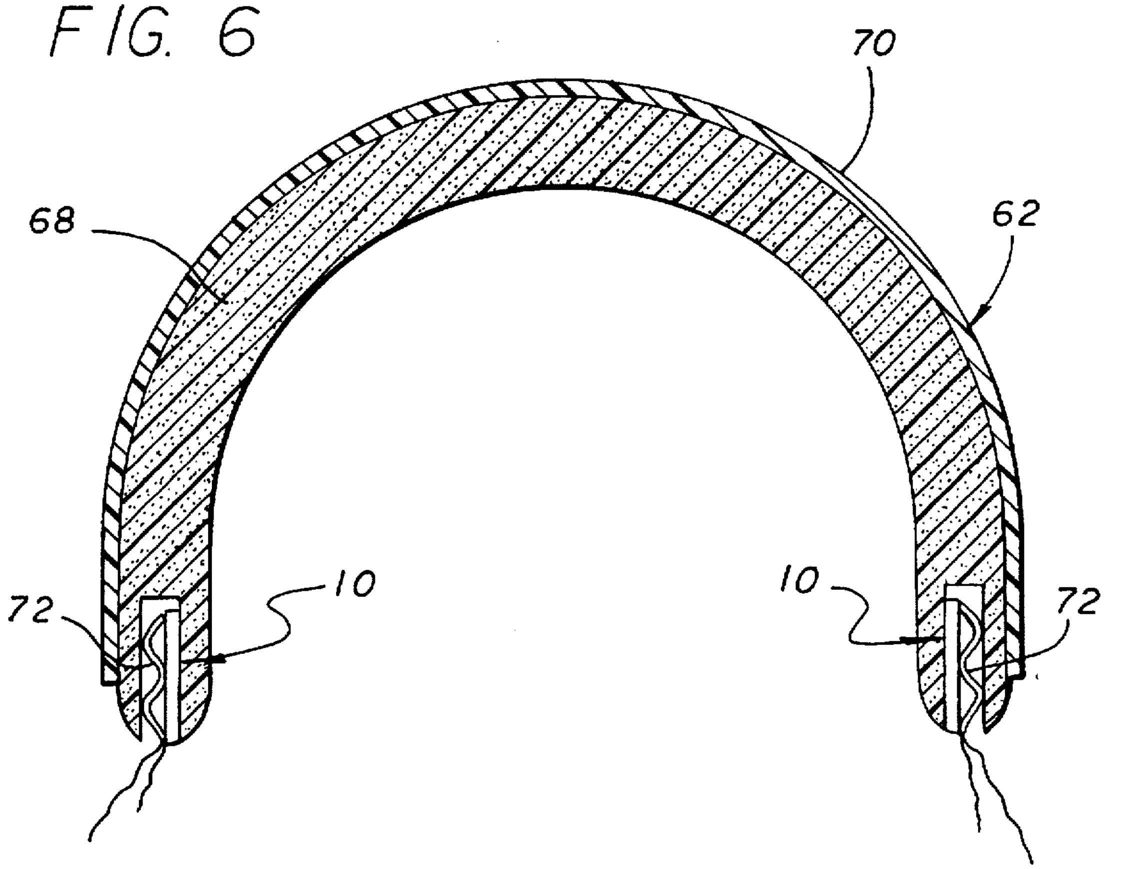
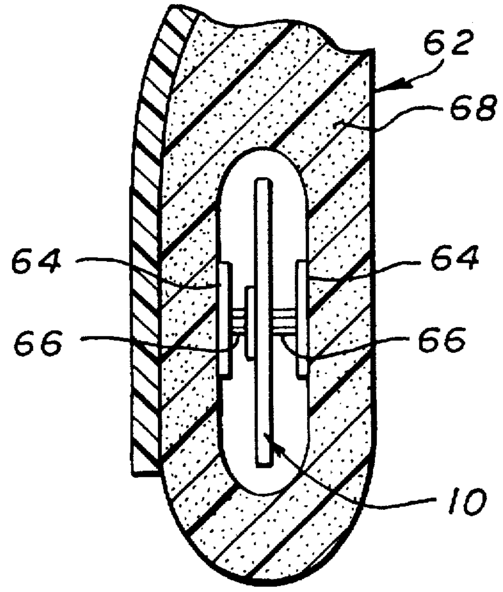
FIG. 7
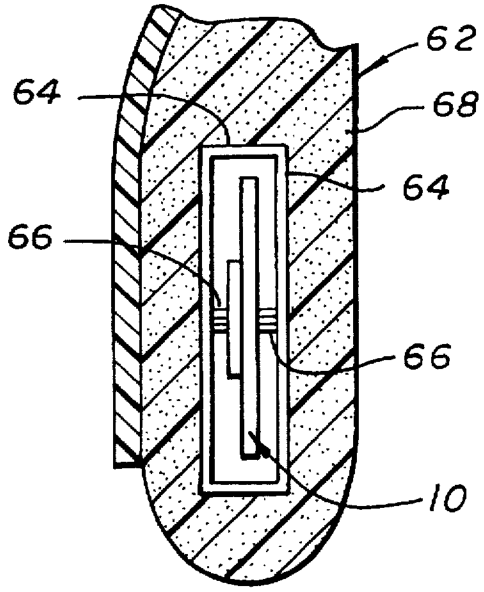
FIG. 8

PIEZOELECTRIC SPEAKER

FIELD OF THE INVENTION

The present invention relates generally to a loudspeaker, and lo more particularly to a loudspeaker that generates sound using piezoelectric material.

BACKGROUND OF THE INVENTION

The present invention relates to a loudspeaker using piezoelectric or electroactive materials. Such materials, as is well known in the art, have the desirable property of converting electrical energy into mechanical energy, by undergoing a controllable amount of deformation when subjected to an applied electric field. Examples of electroactive materials include, among others, piezoelectric ceramics such as the lead zirconate titanate family (commonly known as PZT) with all its variously substituted and doped relatives, electrostrictive ceramics such as certain compositions of lanthanum doped PZT (PLZT) or lead magnesium niobate (PMN), and piezoelectric polymers such as polyvinylidene fluoride (PVDF).

In the speakers, the piezoelectric or electroactive material may be arranged in a variety of ways, including unimorph or bimorph benders. Benders are devices wherein the controlled strain of one or more layers is resisted by other layer or layers, resulting in a bending deformation. The most common benders are classified as unimorphs, which consist of one active layer, and bimorphs, which consist of two active layers. More recently another type of bender was introduced under the name of RAINBOW™ (Reduced and Internally Biased Oxide Wafer) and possessing certain attractive performance characteristics. The RAINBOW™ wafer is described in detail in co-pending application No. 08/021,367, entitled "Monolithic Prestressed Ceramic Devices And Method For Making Same," which is incorporated by reference herein.

It is known to use piezoelectric material in loudspeaker applications. For example, in U.S. Pat. No. 4,969,197 a piezoelectric speaker is disclosed that create an acoustic pressure in air by piezoelectrically driving a diaphragm. The diaphragm is secured to a frame by an elastic material such that the frame does not restrict the vibration of the piezoelectric driver. U.S. Pat. No. 4,352,961 discloses a piezoelectric speaker using a transparent flat panel. These described devices, however, in order to obtain a broad frequency range with high sound pressure require either large mechanical displacement or an acoustical amplifier such as a horn or cone. Therefore, they are dependent on the area of the acoustical driver and lack a broad frequency range. More specifically, the speakers using a large diaphragm or cone feature high lows and low highs, while the speakers using a small diaphragm or cone have high highs and low lows.

The present invention avoids the problem of the known piezoelectric speakers by utilizing the acoustic properties of any rigidly attached structure. By way of example, the rigid structure may include a computer monitor housing, a television set, any welded structure such as an automobile cargo bay or file cabinet, a plastic box, a dry wall or building frame, a small appliance, or a bicycle helmet. In all these applications an acoustical pressure with higher DB level is generated by a significantly larger area of a driving object. In this manner, an entire structure becomes a speaker and in each application possesses numerous acoustical properties dependent upon the material and shape of the attached rigid structure.

The feature of the present invention of utilizing an attached rigid structure for acoustical output includes an additional advantage that it can be of any planar shape to fit an enclosure volume. By way of example, the piezoelectric speaker can fit within a slot, such as in case of a bicycle helmet application, or the piezoelectric speaker can fit within a thin layer space of approximately 0.040" in a computer keyboard application.

SUMMARY OF THE INVENTION

Accordingly, it is a primary object of the present invention to overcome one or more disadvantages and limitations of the prior art. A significant object of the present invention is to provide a piezoelectric speaker that is easily and inexpensively manufactured. It is another object of the present invention to provide a piezoelectric speaker that is easily secured to an existing structure.

According to a broad aspect of the present invention, the speaker includes a rigid structure, a piezoelectric material bender, and a wave guide mounted to both the rigid structure and the bender and serving to interconnect the rigid structure and the bender. The wave guide is a fabricated from a rigid material and is mounted to the bender at approximately the geometric center of the bender. The bender may also be encapsulated in a case. The rigid structure may include a computer keyboard, a bicycle helmet or any other rigid structure.

A feature of the present invention is that the piezoelectric speaker is easily manufactured.

Another feature of the present invention is that the piezoelectric speaker has a broad frequency range.

Another feature of the present invention is that the piezoelectric speaker is easily adapted to existing structures.

These and other objects, advantages and features of the present invention will become readily apparent to those skilled in the art from a study of the following description of an exemplary preferred embodiment when read in conjunction with the attached drawing and appended claims.

BRIEF DESCRIPTION OF THE DRAWING

FIG. 6 is a cross-sectional front view of the piezoelectric speaker of the present invention in a bicycle helmet application;

FIG. 7 is a cross-sectional front view of the piezoelectric speaker of the present invention in an alternative embodiment of a bicycle helmet application;

FIG. 8 is a cross-sectional front view of the piezoelectric speaker of the present invention in another alternative embodiment of a bicycle helmet application;

DESCRIPTION OF AN EXEMPLARY PREFERRED EMBODIMENT

Figure 1:
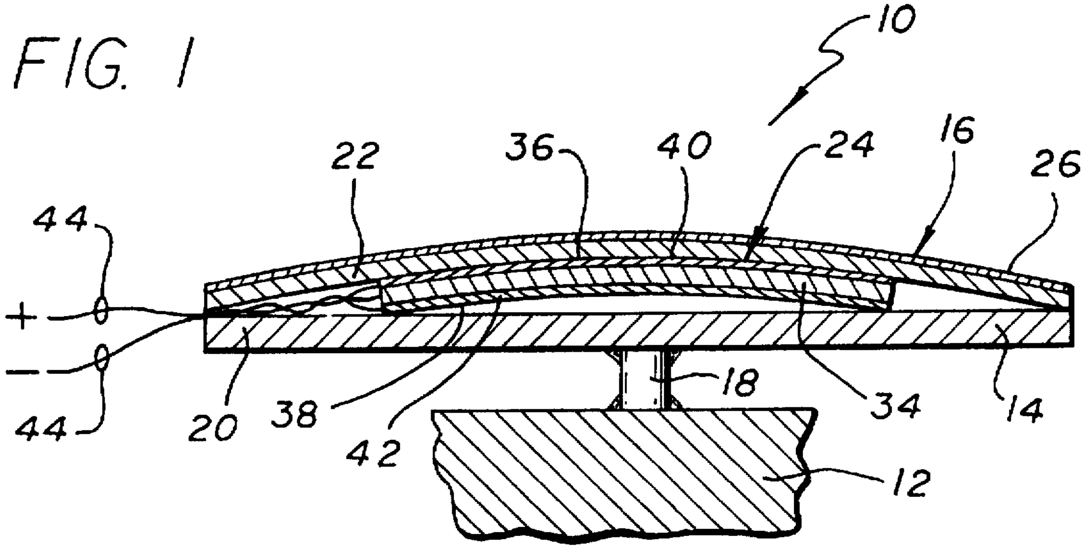
FIG. 1 is a cross-sectional front view of one embodiment of a piezoelectric speaker of the present invention.

Referring now to FIG. 1, a first embodiment of the piezoelectric speaker 10 is shown. The piezoelectric speaker comprises a rigid structure 12, a case 14, a bender 16 disposed within the case and a wave guide mechanism 18 mounted to both the rigid structure 12 and the case 14 and serving to preferably rigidly interconnect the rigid structure and the case. The bender 16 may be referred to as a piezodriver.

The case 14 further comprises a base portion 20 and a top portion 22. The base portion 20 is preferable fabricated from a punchboard or other acoustically sound material. The top portion 22 is preferably fabricated from a manila or other flexible material.

Figure 4:
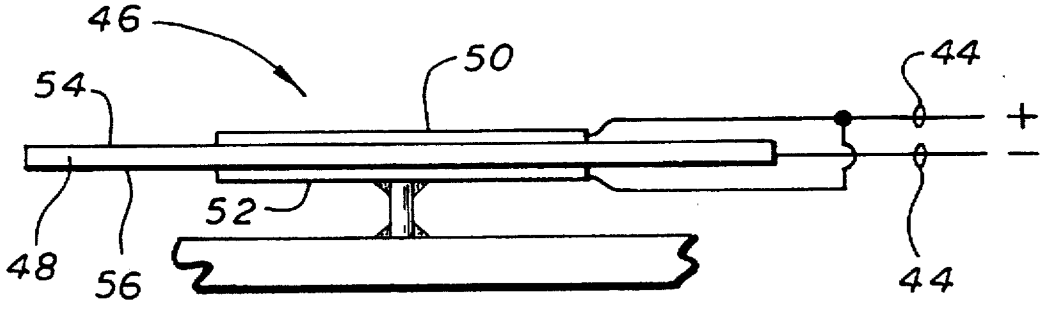
FIG. 4 is a front view of the bimorph bender of the piezoelectric speakers of the present invention.

The bender 16 preferably utilizes a piezoelectric wafer 24 or piezowafer and may comprise several different structures. One option is a unimorph piezoelectric structure that includes a piezoelectric material wafer bonded to a stiff shim. A second alternative is a bimorph piezoelectric structure. The bimorph structure may include either two piezoelectric wafers bonded together or two piezoelectric wafers having a stiff shim bonded between the two wafers, as best shown in FIG. 4. It should be noted that the piezoelectric material wafers may be replaced by any type of electroactive material that responds to an electric field by developing a strain. A third alternative is a RAINBOW™ wafer. Additionally, another advantage of the present invention is that the piezoelectric structure is easily manufactured because the thickness of the piezoelectric material may be greater than eight mils.

The case 14 may further include an additional layer 26 on the top portion 2. The additional layer 26 may be comprised of an adhesive type material and provides additional rigidity to the case. The encapsulation of the bender in acoustically sound material such as the plastics of keyboards or computer monitors makes the proposed concept very effective in that it utilizes less space, has improved frequency of sound, and has improved sensitivity. An encapsulated piezowafer creates stress waves as a reaction to an electrical voltage potential input and transmits acoustic waves through the entire structure surface into air. The encapsulation also provides a high durability to entire package, sustainability to harsh shock and vibrational environments.

Figure 2:
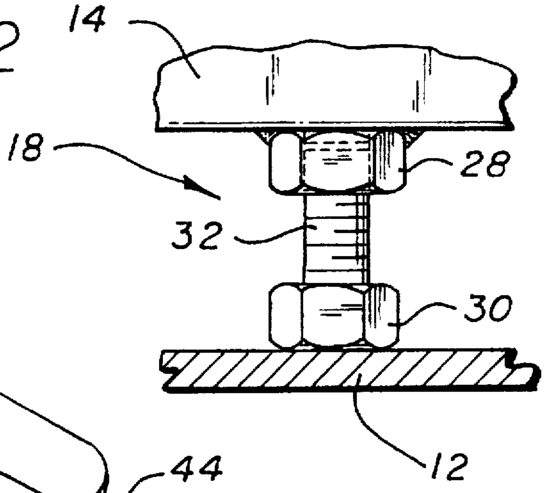
FIG. 2 is a front view of an alternative embodiment of a wave guide of mechanism of the piezoelectric speaker of the present invention.

Another feature of the present invention shown in FIGS. 1 and 2 is that the vibrational mechanical energy of the piezodriver bender 16 is propagated through the wave guide mechanism 18 into the rigidly attached structure 12. An optimal effect is created when the mechanical impedance of an attached structure is matched with a piezodriver impedance.

The following equation illustrate this concept. The mass of a speaker is represented as $M_1$ and the concentrated mass of the attached rigid structure, which participates in vibration, is represented as $M_2$. Both masses posses a frequency of vibration w depending on a stiffness k of the layer of attached structure.

$$w=\sqrt{\frac{k(M_1+M_2)}{(M_1M_2)}} \tag{1}$$

and since $M_1 \ll M_2$ $$w\approx\sqrt{k/M_2} \tag{2}$$

which indicates a broad range of transmitting frequencies, because k is generally large and $M_2$ generally small.

This rigid attachment constrains a mechanical displacement of the bender, which is opposite to the known piezoelectric speakers or conventional loudspeakers. The conceptual difference between conventional design and the design of the present invention is seen from the piezo electromechanical equation:

$$S=sT+dE \tag{3}$$

Wherein

S=strain

T=stress

E=electric field s=elastic compliance d=piezoelectric constant

In the case of a conventional piezospeaker, T is approxiamtely equal to 0 since no significant stress occurs in the piezo wafer because it is freely suspended in the air without constraint, and therefore equation (3) becomes:

$$S=dE \tag{4}$$

In comparison, in the preent invention S is approximately equal to 0, because the strain of the piezowafer is reduced to a minimum by the rigid attachment, preloading, and encapsulation of the piezowafer. The stress is maximal and therefore:

$$-sT=dE \tag{5}$$

which is more effective for driving acoustical waves through material.

Another advantage of the present invention is that the wave guide mechanism 18 features a one point attachment. A short bolt, pin or rod is attached in the location of highest vibrational energy, which in the case of RAINBOW, bimorph, or unimorph benders is the geometrical center of the piezoelectric wafer. This feature provides simplicity, compactness and low cost for the design.

The wave guide 18 is preferably comprised of a a rigid material such as a metal rod and is attached to a center portion of the case or bender by an adhesive or other securing means. The wave guide may comprise a nut or bolt. An alternative embodiment of the wave guide 18 is shown in FIG. 2. In this embodiment, the wave guide 18 is constructed of a a first nut 28, secured to the case 14 and a second nut 30 secured to the rigid structure 12. A bolt 32 serves to interconnect the two nuts 28, 30.

The piezoelectric speaker embodiment shown in FIG. 1 utilizes a RAINBOW wafer 34 having a dome structure. The wafer 34 defines a first surface 36 and a second surface 38. A first electrode 40 is mounted adjacent the first surface 36 and a second electrode 42 is mounted adjacent the second surface 38. Electric leads 44 are attached to the electrodes. The RAINBOW wafer has an initial unbiased height. The wafer is preferably preloaded by being compressed to approximately 50% of the initial unbiased height before it is disposed within the case.

The benders used in the piezoelectric speakers are preferably preloaded. The preload of the piezoelectric bender wafers can be achieved in various ways. By way of example, a RAINBOW wafer is preferably preloaded by a simple biased deformation of a dome structure to 50% of its height. The bimorph or unimorph benders may be preloaded by being pressed fit. Alternatively, the bimorph or unimorph benders may be preloaded with a spring, such as the flat curved disk type.

Transmission of sound into a foam structure, such as described herein with reference to FIGS. 6–10, is specifically accentuated by spring preloading. In this application the entire wafer surface becomes a wave guide where k (stiffness) of the relatively soft material is increased by preloading the entire wafer surface.

Figure 3:
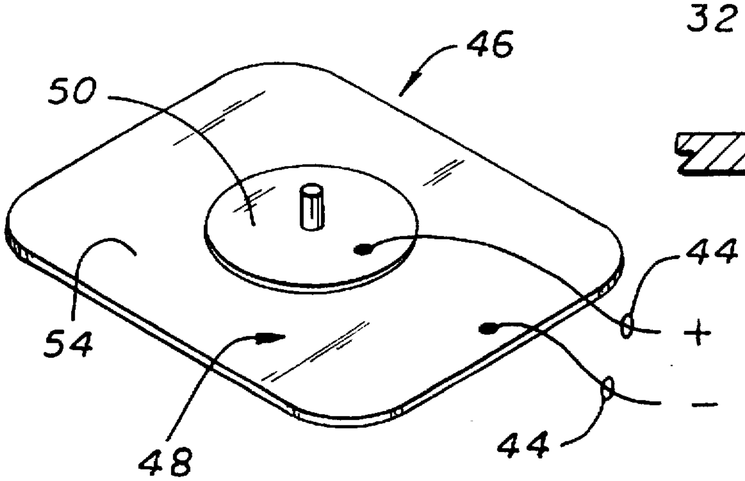
FIG. 3 is a perspective view of a bimorph bender of the piezoelectric speaker of the present invention.

Referring now to FIGS. 3 and 4, a bimorph embodiment 46 of the present invention is shown. In this embodiment, the bender includes a shim 48, a first piezoelectric material wafer 50 and a second piezoelectric material wafer 52. The shim defines a first surface 54 and a second surface 56. The first piezoelectric material wafer is bonded to the first surface of the shim and the second piezoelectric material wafer is bonded to the second surface of the shim. The shim 48 is preferably fabricated from a steel or brass material. The leads 44 connect the piezoelectric material wafers to an electrical audio signal. Alternatively, in a unimorph embodiment (not shown) a first piezoelectric material wafer is bonded to a first surface of a shim. The piezoelectric material wafers are bonded to the shim such that the surface of the shim is in contact with the electrodes of the piezoelectric material wafer. The wave guide in both the unimorph and bimorph embodiments is secured to the center of the wafer.

The shim 48 may be configured in any shape. However, for maximum quality of sound, it is desirable that the ratio of the main axis to the minor axis be approximately the square root of two and that the corners are in ellipse relationship wherein n=5–10. This relationship is demonstrated by the following equation:

$$x(n/a)+y(n/b)=1$$

where a=major axis b=minor axis $b=\sqrt{2}$

Figure 5:
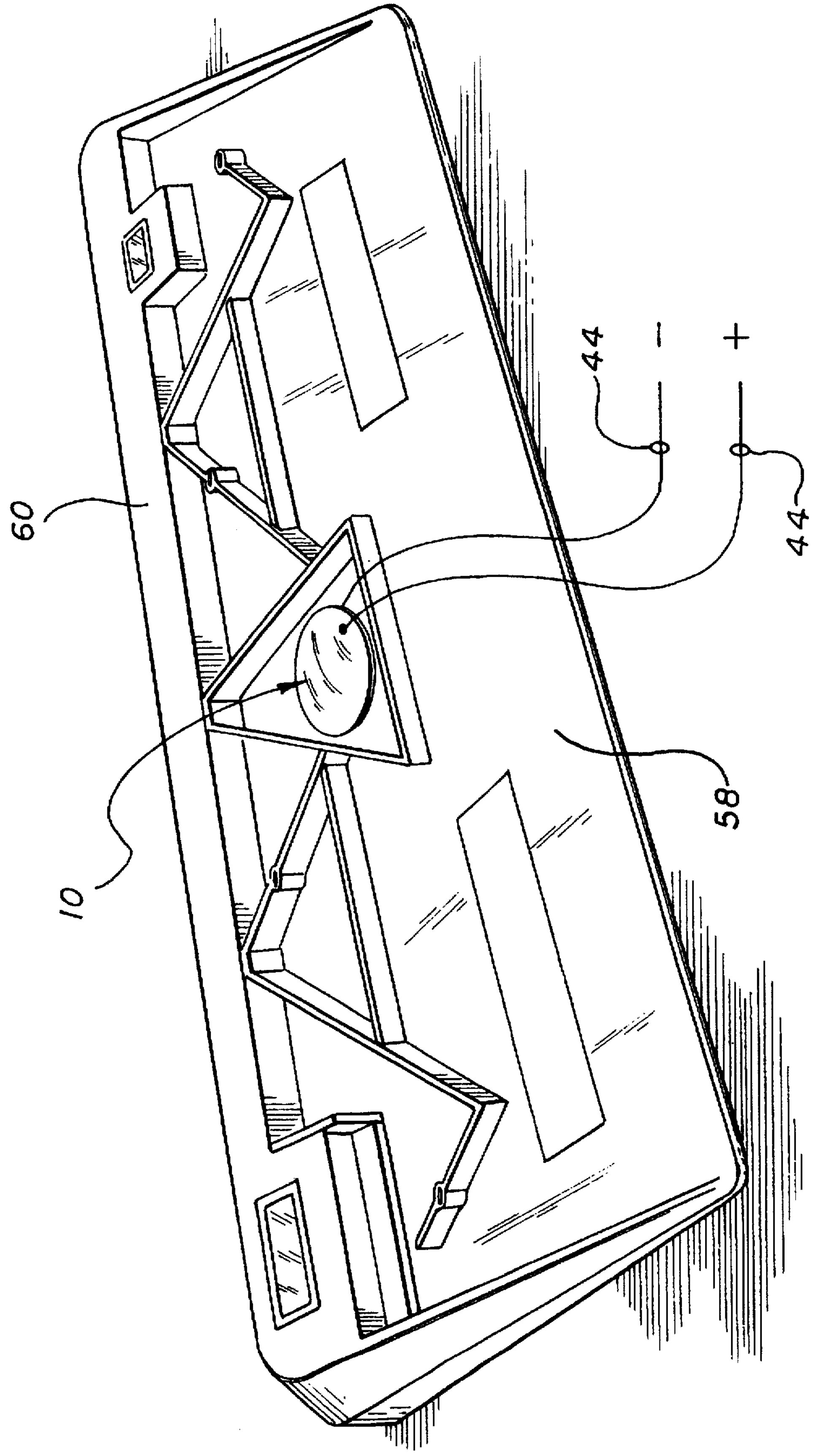
FIG. 5 is a perspective view of the piezoelectric speaker of the present invention in a computer keyboard application.

Referring now to FIG. 5, the piezoelectric speaker is shown utilizing a computer keyboard 58 as the rigid structure. The piezoelectric speaker 10 is preferably attached to a plastic housing 60 of the computer keyboard, where space is available. In the embodiment shown, the piezoelectric speaker 10 is attached to the molded keyboard housing 60 and the electrical leads 44 are connected to an electrical audio source.

Referring now to FIG. 6, a piezoelectric speaker utilizing a bicycle helmet 62 as the rigid structure is shown. In this embodiment, the piezoelectric speakers 10 are built in a foam layer 68 that is disposed inside an outer shell 70 of the bicycle helmet. This embodiment utilizes curved disk type springs 72 to facilitate the preload for better acoustical coupling.

Figure 9:
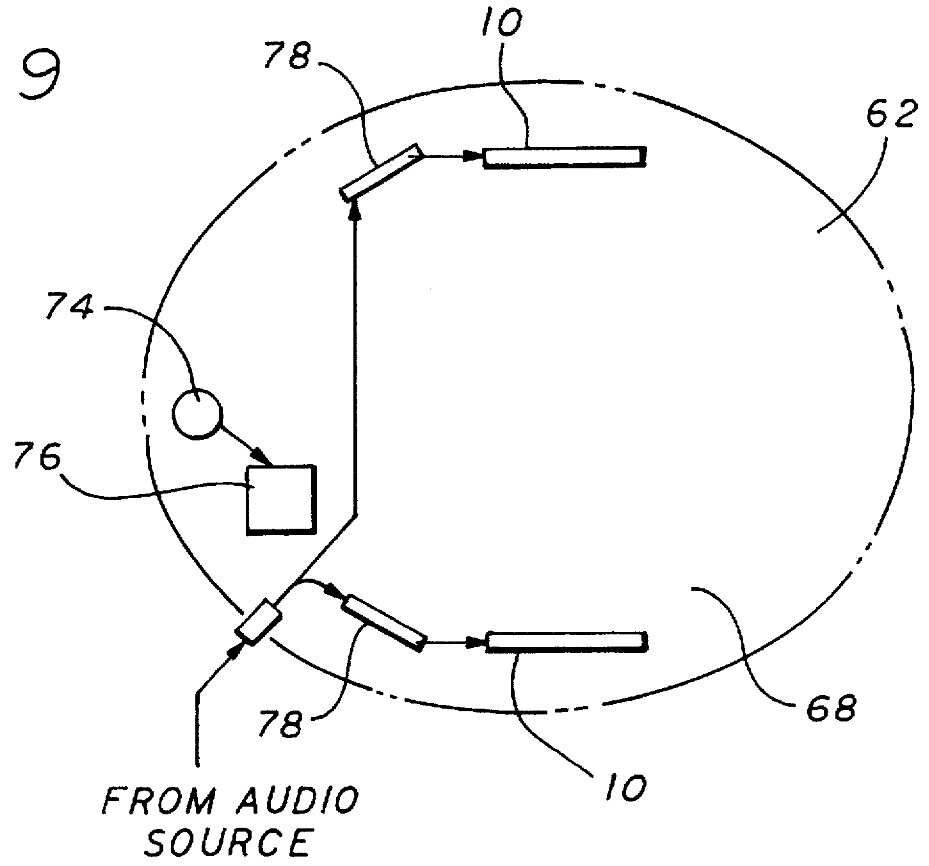
FIG. 9 is a top view of the piezoelectric speaker of the present invention in the bicycle helmet application.
Figure 10:
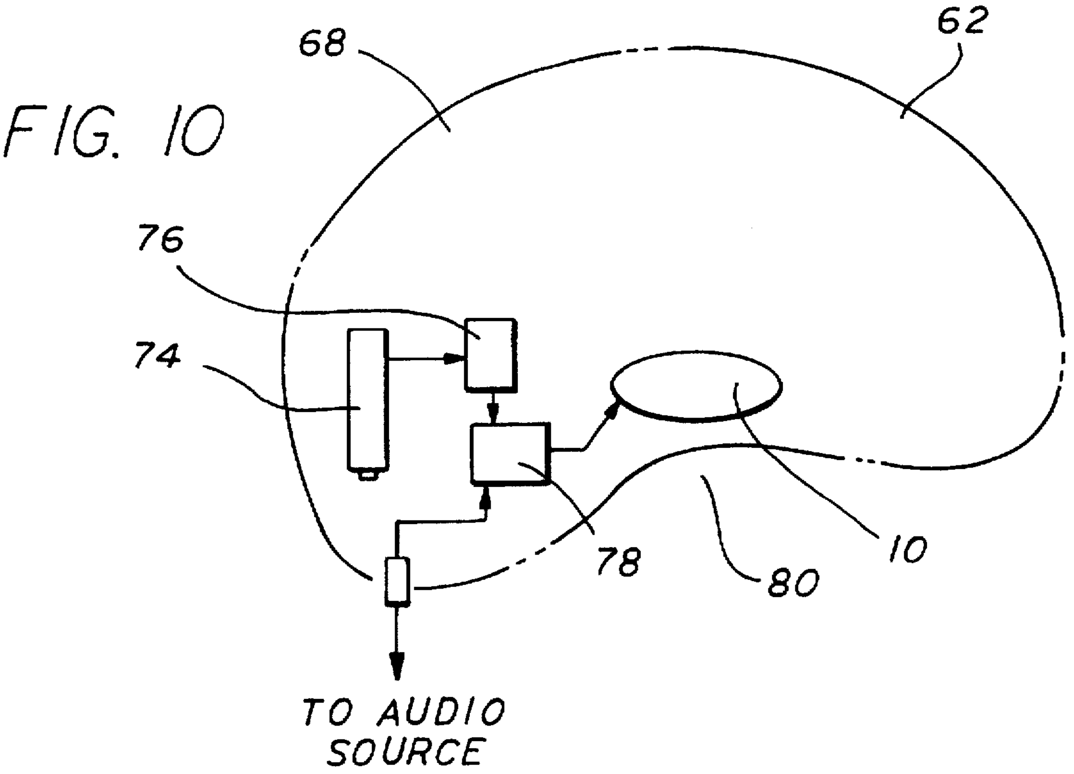
FIG. 10 is a side view of the piezoelectric speaker of the present invention in the bicycle helmet application.

Referring now to FIGS. 9 and 10 another embodiment of the piezoelectric speaker utilizing the bicycle helmet 62 as the rigid structure is shown. In this embodiment, the speaker 10 is attached by two shims 64 made out of sheet metal. Two nuts 66 function as the wave guide to the foam structure. An advantage of this embodiment of the piezoelectric speaker is that the entire package may be molded into a foam layer 68 within the bicycle helmet 62. In this manner, a bicyclist does not require any additional power sources attached to other parts of the body or carried by hand. Additionally, the piezoelectric speakers are molded above the bicyclist's ear, therefore preventing any obstruction to the bicyclists ears. Shims 64 may also function as an enclosure of the piezospeakers 10 as shown in FIG. 8.

The packaging of the piezoelectric speaker within the foam layer of the bicycle helmet is shown in FIGS. 9 and 10. FIG. 9 demonstrates how entire circuit is molded into the foam lining 68. A battery 74, a converter 76, and a voltage amplifier 78 are molded into the foam and two speakers 10 for stereo sound are molded above a bicyclist earhole 80.

Figure 11:
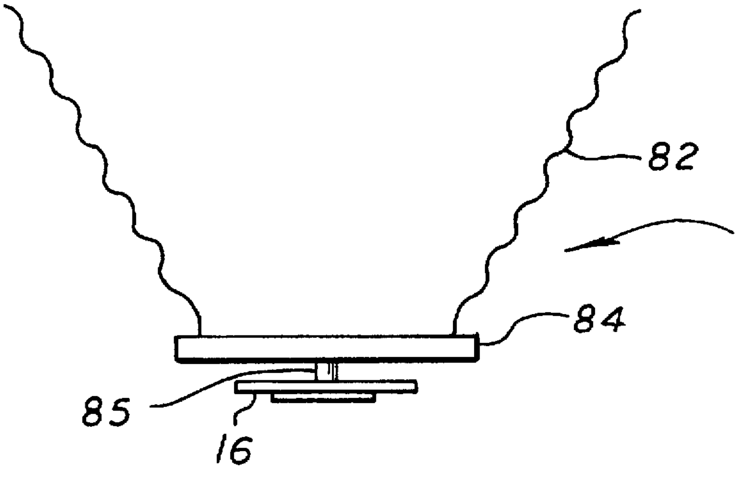
FIG. 11 is a front view of the piezoelectric speaker of the present invention in a conventional speaker application.

Referring now to FIG. 11, an embodiment of the piezoelectric speaker 10 is shown wherein the rigid structure is a conventional loudspeaker cone 82. The cone is attached to the bender 16 through an intermediate plate 84 and a waveguide 85. The plate 84 may be fabricated from a punchboard or other acoustically sound material.

Figure 12:
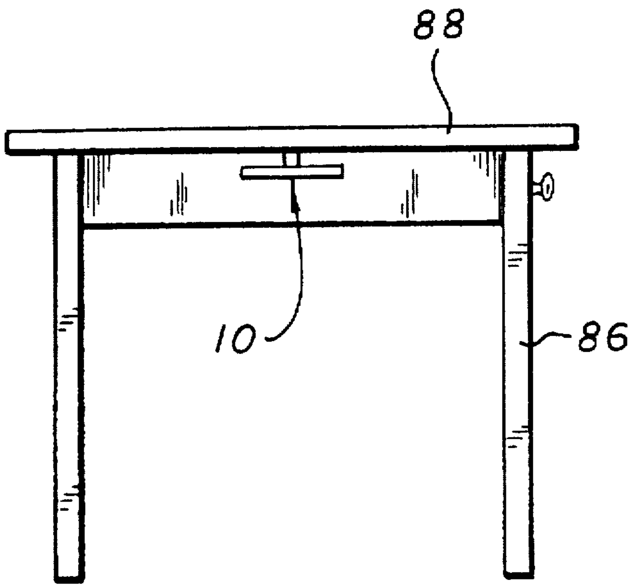
FIG. 12 is a front view of the piezoelectric speaker of the present invention in a desk application.

Referring now to FIG. 12, an embodiment of the piezoelectric speaker is shown wherein the rigid structure is an office desk 86. The speaker 10 is secured to the a top surface 88 of the desk 86, such that the entire top surface 88 of the desk functions as a speaker.

Figure 13:
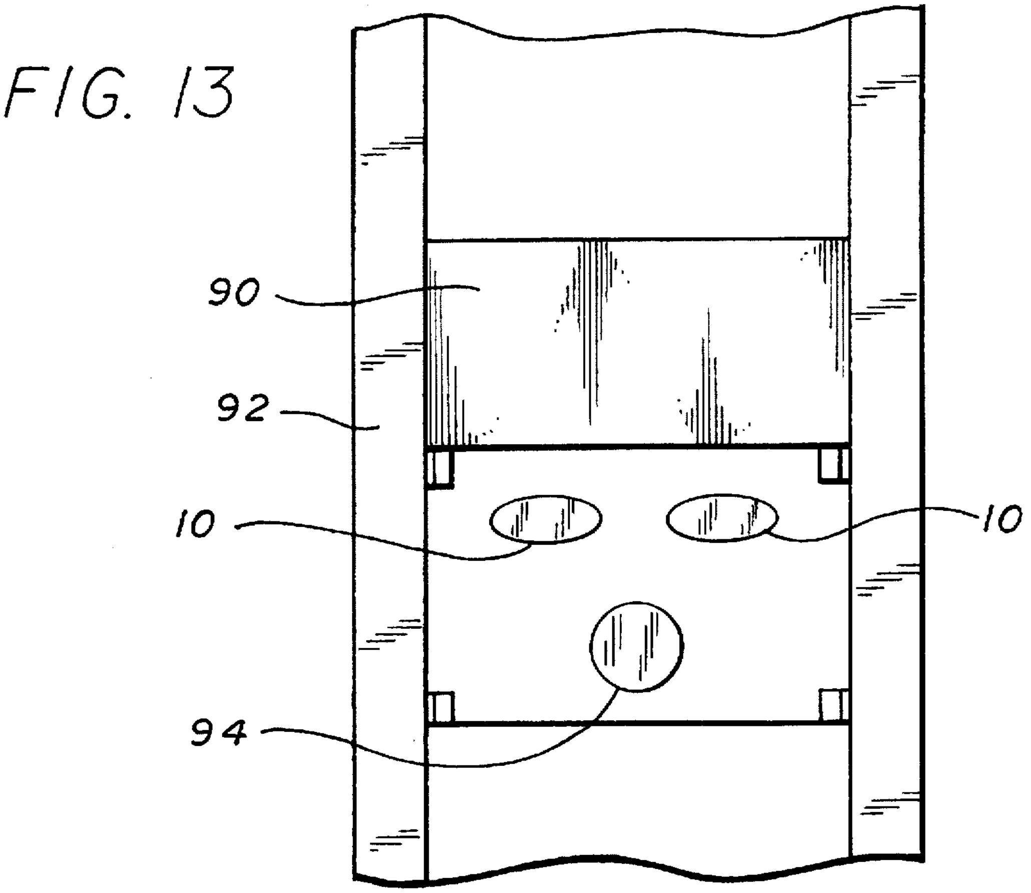
FIG. 13 is a front view of the piezoelectric speaker of the present invention in a building frame and drywall application.
Figure 14:
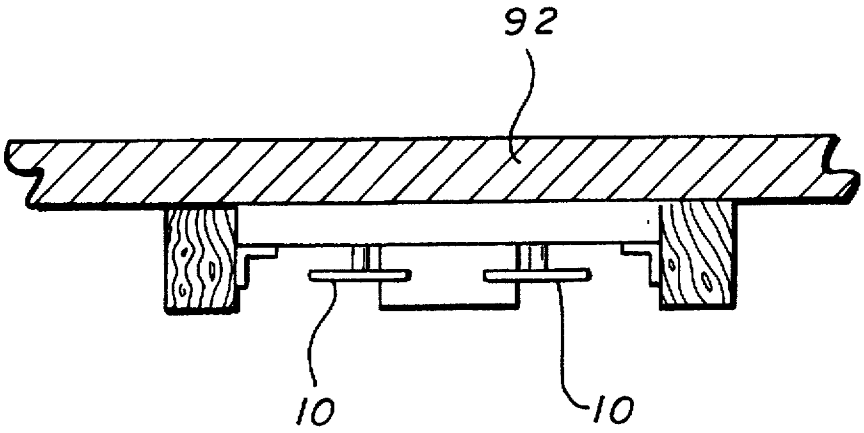
FIG. 14 is a side view of the piezoelectric speaker of FIG. 13.

Referring now to FIGS. 13 and 14, an embodiment of the piezoelectric speaker is shown wherein the rigid structure is a drywall material 90. This embodiment allows the present invention to be used as a home entertainment system. The speaker 10 is secured to the housing frame 92 or drywall 90 within the frame. The speakers may be used for music or paging purposes.

A feature of embodiment shown in FIG. 13 is the use of a third speaker 94 and the utilization a tuned circuit with the piezoelectric speakers 10. The tuned circuit allows accentuation of any desired frequency from the piezoelectric speaker by combining two, three or four speakers. As a result, higher fidelity sound can be obtained.

Figure 15:
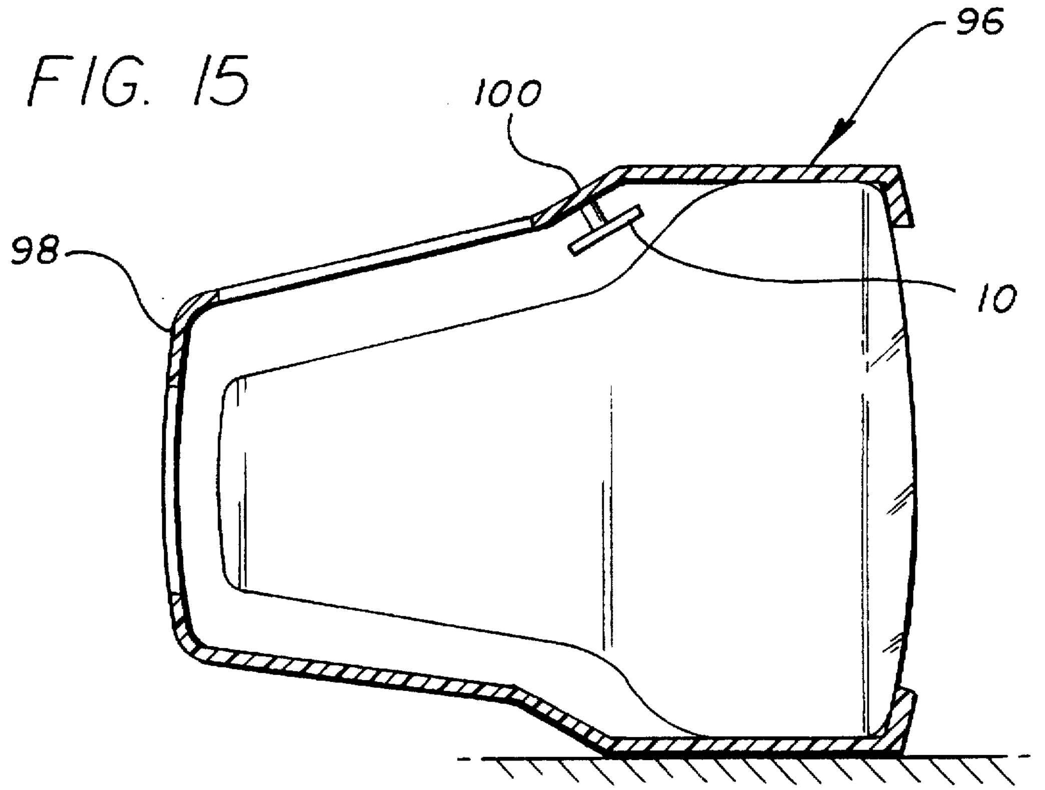
FIG. 15 is a side view of the piezoelectric speaker of the present invention in a computer monitor application.
Figure 16:
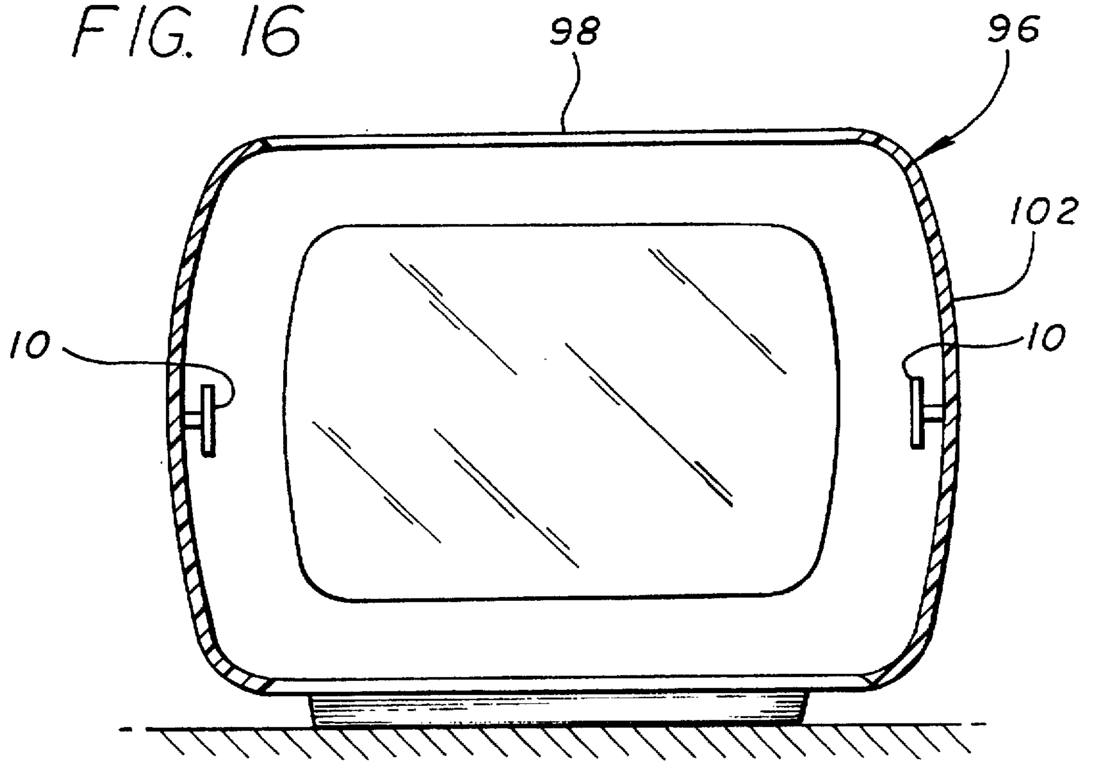
FIG. 16 is a front view of the piezoelectric speaker of the present invention in an alternative embodiment of a computer monitor application.

Referring now to FIGS. 15 and 16, an embodiment of the piezoelectric speaker is shown wherein the rigid structure is a computer monitor 96. The piezoelectric speaker 10 is secured to an upper wall 100 of a plastic shell 98 of the computer monitor. Alternatively, the speaker may be secured to a sidewall 102 of the plastic shell 98 of the computer monitor 96.

Figure 17:
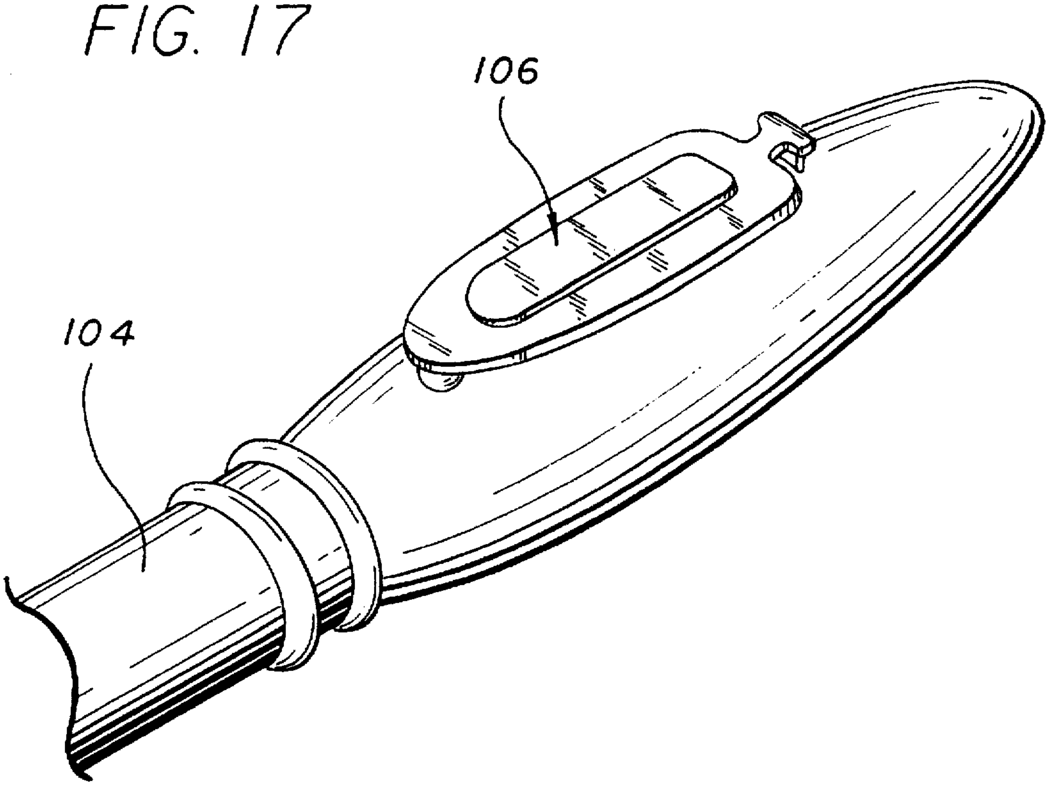
FIG. 17 is a perspective view of the piezoelectric speaker of the present invention in a pen application.
Figure 18:
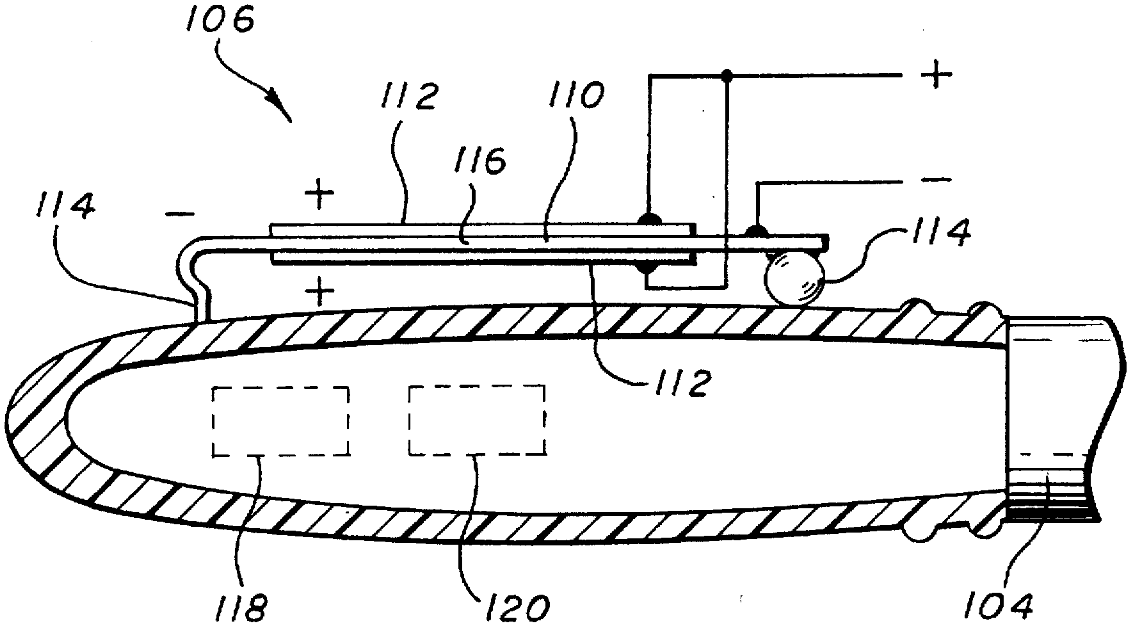
FIG. 18 is a cross-sectional side view of the piezoelectric speaker of FIG. 17.

Referring now to FIGS. 17 and 18, an embodiment of the piezoelectric speaker is shown wherein the rigid structure is a pen or pencil 104. In this embodiment the speaker 10 is preferably secured to a clip 106 of the pen or pencil. As shown in FIG. 18, the bender 16 may comprise a bimorph having a shim 110, two wafers 112, and two wave guides 114. The electrical leads are connected internally to an electrical sources 118. A power supply 120 is also located within the pen or pencil 104.

Figure 19:
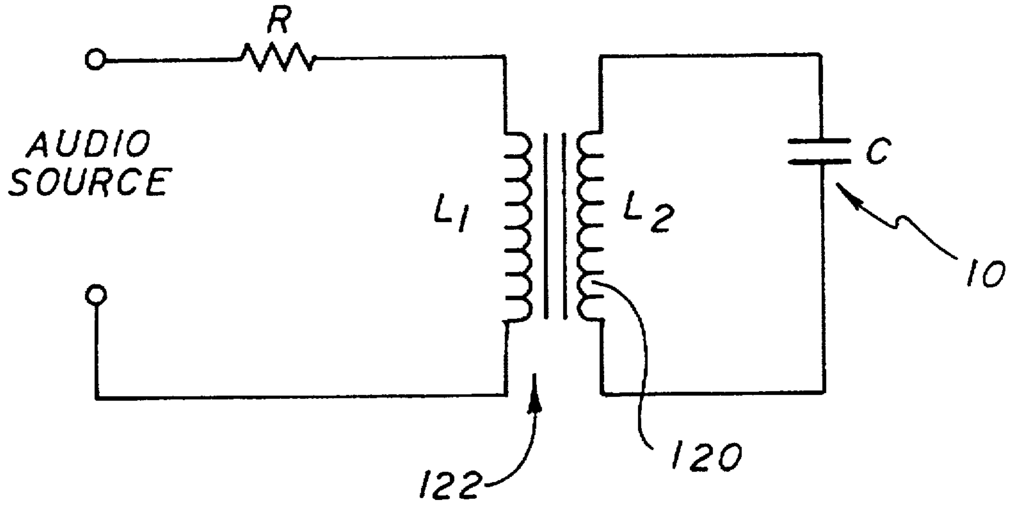
FIG. 19 is a schematic of the secondary winding of the piezoelectric speaker of the present invention.

Referring now to FIG. 19, a secondary winding 120 of transformer 122 is shown that can be tuned to a desired frequency by selecting inductance L2 as a function of capacitance C of the piezoelectric speaker. By utilizing two to three piezospeakers tuned for low, mid and high range, one can build high quality entertainment center with low cost and low power consumption.

There has been described hereinabove an exemplary preferred embodiment of the piezoelectric speaker according to the principles of the present invention. Those skilled in the art may now make numerous uses of, and departures from, the above-described embodiments without departing from the inventive concepts disclosed herein. Accordingly, the present invention is to be defined solely by the scope of the of the following claims.

We claim as our invention:

1. A piezoelectric speaker comprising:

a bender;

a case encapsulating said bender, wherein said bender has an unbiased height and further wherein said bender is compressed to approximately fifty percent of the unbiased height when encapsulated in the ease;

a rigid structure interconnected to said case, said rigid structure being structurally distinct from said case; and a wave guide mounted to both said rigid structure and said case and serving to interconnect said rigid structure and said case, wherein said wave guide is fabricated from a rigid material.

2. A piezoelectric speaker comprising:

a rigid structure;

a bender interconnected to said rigid structure, said bender being preloaded by biased deformation, wherein said bender has an unbiased height and further wherein said bender is compressed to approximately fifty percent of the unbiased height preloaded;

a wave guide mounted to both said rigid structure and said bender and serving to interconnect said rigid structure and said bender.

* * * * *